(12) United States Patent
Rankin et al.

(10) Patent No.: US 8,159,278 B2
(45) Date of Patent: Apr. 17, 2012

(54) METHOD FOR CLAMPING A SEMICONDUCTOR REGION AT OR NEAR GROUND

(75) Inventors: Samuel Patrick Rankin, Phoenix, AZ (US); Robert C. Dobkin, Monte Sereno, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/178,302

(22) Filed: Jul. 7, 2011

(65) Prior Publication Data
US 2012/0007649 A1    Jan. 12, 2012

Related U.S. Application Data

(63) Continuation of application No. 12/033,600, filed on Feb. 19, 2008, now abandoned.

(60) Provisional application No. 60/908,922, filed on Mar. 29, 2007.

(51) Int. Cl.
 *H03K 5/08* (2006.01)
(52) U.S. Cl. ............... 327/313; 327/321; 327/331
(58) Field of Classification Search ............... 327/313, 327/321, 331
See application file for complete search history.

(56) References Cited

U.S. PATENT DOCUMENTS

| | | | |
|---|---|---|---|
| 3,704,383 A | 11/1972 | Ault et al. | |
| 4,027,177 A | 5/1977 | Davis | |
| 4,475,077 A | 10/1984 | Nagano | |
| 4,704,654 A | 11/1987 | Aberle et al. | |
| 4,831,323 A | 5/1989 | Melbert | |
| 4,926,073 A | 5/1990 | Pigott et al. | |
| 5,073,732 A | 12/1991 | Bockelmann | |
| 5,121,004 A | 6/1992 | Kesler et al. | |
| 5,399,914 A | 3/1995 | Brewster | |
| 5,404,096 A | 4/1995 | Thiel | |
| 5,910,737 A | 6/1999 | Kesler | |

(Continued)

FOREIGN PATENT DOCUMENTS

JP    07-147532    11/1993

(Continued)

OTHER PUBLICATIONS

International Search Report, with Written Opinion, issued in International Patent Application No. PCT/US2008/058039 dated on Jun. 23, 2008.

*Primary Examiner* — Kenneth B. Wells
(74) *Attorney, Agent, or Firm* — McDermott Will & Emery LLP

(57) ABSTRACT

A clamping circuit clamps a voltage received by an n-type semiconductor region without using a Schottky transistor. The clamping circuit includes a current mirror as well as first and second bipolar transistors. The current mirror receives a first current and supplies a second current in response. The first current is received by the first bipolar transistor, and the second current is received by the second bipolar transistor. The difference between the base-emitter junction voltages of the first and second bipolar transistors, in part, defines the voltage at which the n-type region is clamped. To start-up the circuit properly, current is withdrawn from the base/gate terminals of the transistors disposed in the current mirror. The circuit optionally includes a pair of cross-coupled transistors to reduce the output impedance and improve the power supply rejection ratio.

14 Claims, 4 Drawing Sheets

U.S. PATENT DOCUMENTS

| | | |
|---|---|---|
| 5,966,006 A | 10/1999 | Migliavacca |
| 6,137,278 A | 10/2000 | Koffler et al. |
| 6,281,735 B1 | 8/2001 | Page |
| 7,646,412 B2 * | 1/2010 | Hisamatsu et al. ........... 348/257 |
| 7,760,004 B2 * | 7/2010 | Barrow et al. ................ 327/328 |
| 7,994,858 B2 * | 8/2011 | Standley et al. .............. 330/253 |

FOREIGN PATENT DOCUMENTS

JP        2003-198298        11/2003

* cited by examiner

METHOD FOR CLAMPING A SEMICONDUCTOR REGION AT OR NEAR GROUND

CROSS-REFERENCES TO RELATED APPLICATIONS

The present application is a Continuation of U.S. application Ser. No. 12/033,600, filed Feb. 19, 2008 now abandoned, which claims benefit under 35 USC 119(e) of U.S. provisional Application No. 60/908,922, filed Mar. 29, 2007, entitled "Method For Clamping A Semiconductor Region At Or Near Ground", the contents of each of which is incorporated herein by reference in its entirety.

BACKGROUND OF THE INVENTION

The present invention relates to semiconductor integrated circuits, and more particularly to a circuit for clamping the voltage received by an n-type region formed in a semiconductor substrate.

One conventional technique for ensuring that the voltage applied to an n-type semiconductor region does not fall significantly below the ground potential, is to place a Schottky diode between the n-type region and the ground, and further, to place a current limiting resistor between the n-type region and the node that may pull the n-type region below the ground potential, as shown in FIG. 1. As node 16 is pulled below the ground potential, Schottky diode 12 is forward biased thus maintaining n-type region 10 clamped at a forward Schottky diode voltage below the ground potential.

One disadvantage of the clamping circuit shown in FIG. 1 is that Schottky diode 12, which is a metal-semiconductor junction may not be available for use. Second, if the Schottky diode has a relatively high series resistance and/or a high forward voltage, n-type region 10 may be clamped at a voltage sufficiently below the ground potential as to cause an associated parasitic lateral NPN transistor to turn on.

SUMMARY OF THE INVENTION

In accordance with the present invention, a clamping circuit clamps a voltage received by an n-type semiconductor region without using a Schottky transistor. In accordance with one embodiment, the clamping circuit includes a current mirror as well as first and second bipolar transistors. The current mirror receives a first current and supplies a second current in response. The first current is received by the first bipolar transistor, and the second current is received by the second bipolar transistor. The difference between the base-emitter junction voltages of the first and second bipolar transistors defines the voltage at which the n-type region is clamped. To start-up the circuit properly, current is withdrawn from the base (gate) terminals of the transistors disposed in the current mirror.

In accordance with another embodiment, a clamping circuit includes a current mirror, as well as first, second, third and fourth bipolar transistors. The third and fourth bipolar transistors form across-coupled transistor pair. The current mirror receives a first current and supplies a second current in response. The first current is received by the first and third bipolar transistors. The second current is received by the second and fourth bipolar transistors. The emitter-base junction voltages of the first and second bipolar transistors together with the base-emitter junction voltages of the third and fourth transistors define the voltage at which the n-type region is clamped. A current source supplying a current to the first bipolar transistor ensures that the clamping circuit starts up properly.

In accordance with another embodiment, a clamping circuit includes a current mirror, as well as first, second, third and fourth bipolar transistors. The third and fourth bipolar transistors form a cross-coupled transistor pair. The current mirror receives a first current and supplies a second current in response. The first current is received by the first and third bipolar transistors. The second current is received by a fifth transistor coupled to the first and third transistor and adapted to develop a base-emitter voltage substantially similar to the base-emitter voltage of the first and third transistors. The emitter-base junction voltages of the first and second bipolar transistors together with the base-emitter junction voltages of the third and fourth transistors define the voltage at which the n-type region is clamped. To start-up the circuit properly, current is withdrawn from the base (gate) terminals of the transistors disposed in the current mirror.

DETAILED DESCRIPTION OF THE INVENTION

In accordance with the present invention, an n-type semiconductor region is clamped at or near the ground potential without the use of a Schottky transistor. Although the following description is provided with reference to bipolar transistors, it is understood that MOS transistors may also be used to clamp an n-type semiconductor region in accordance with the present invention.

Figure 1:
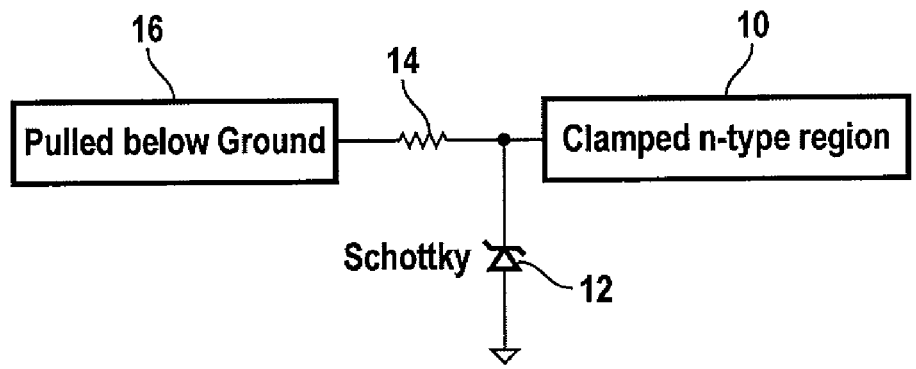
FIG. 1 is a schematic diagram of a circuit adapted to clamp the voltage applied to an n-type semiconductor region, as known in the prior art.
Figure 2:
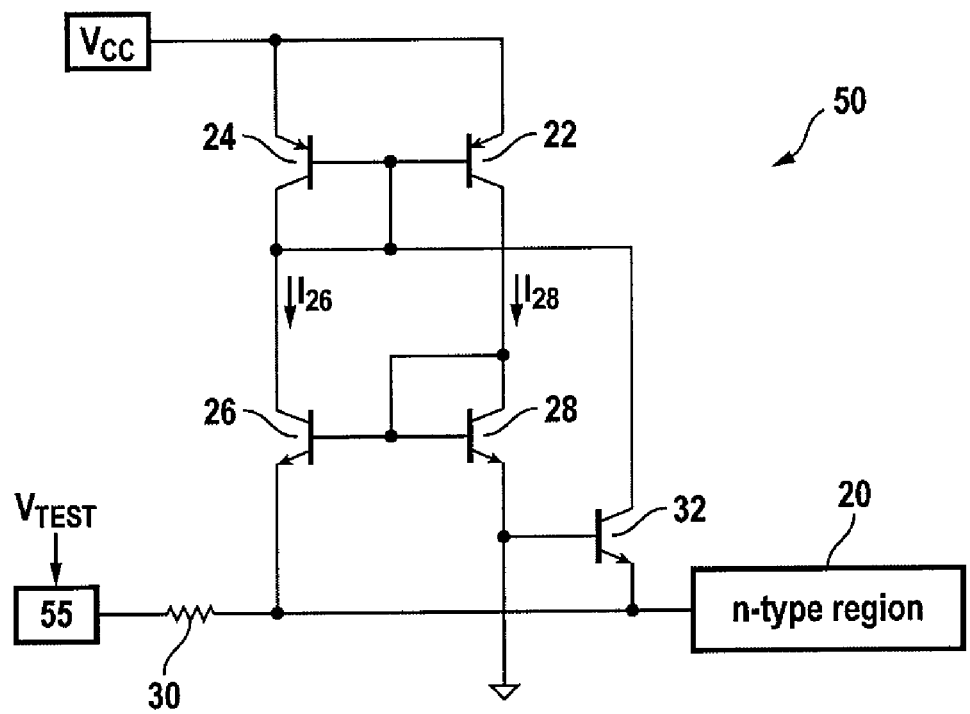
FIG. 2 is a schematic diagram of a circuit adapted to clamp the voltage applied to an n-type semiconductor region, in accordance with one exemplary embodiment of the present invention.

FIG. 2 is a transistor schematic diagram of a clamping circuit 50 adapted to clamp n-type semiconductor region 20 to a known voltage, in accordance with one exemplary embodiment of the present invention. Clamping circuit 50 is shown as including bipolar PNP transistors 22, 24, as well as bipolar NPN transistors 26, 28. PNP transistors 22 and 24 have the same base-emitter voltage and form a current mirror. Accordingly, current 128 supplied by the current mirror is proportional or substantially equal to current $I_{26}$ received by the current mirror. Current limiting resistor 30 is disposed between the emitter terminal of transistor 26 and node 55 to which voltage $V_{Test}$ is applied.

As voltage $V_{Test}$ is pulled below the ground potential, transistor 32 begins to draw a relatively small amount of current from the base terminals of transistors 22 and 24, thereby causing clamping circuit 50 to start up properly. Because transistors 22 and 24 form a current mirror, the ratio of the collector current $I_{26}$ of transistor 26 to the collector current $I_{28}$ of transistor 28 is determined by the relative base-emitter areas of transistors 22 and 24.

Assume that the ratio of the base-emitter area of transistor 22 to transistor 24 is X. The voltage received by n-type region 20 with respect to the ground potential is defined by the difference between the base-emitter regions of transistors 26 and 28, namely $VBE_{28}-VBE_{26}$, where $VBE_{28}$ is the voltage across the base-emitter terminals of transistor 28 and $VBE_{26}$ is the voltage across the base-emitter terminals of transistor 26. Voltages $VBE_{26}$ and $VBE_{28}$ are related to currents $I_{26}$ and $I_{28}$ according to the following:

$$VBE_{28}=(kT/q)*\ln(I_{28}/I_{s28}) \quad (1)$$

$$VBE_{26}=(kT/q)*\ln(I_{26}/I_{s26}) \quad (2)$$

$$VBE_{28}-VBE_{26}=(kT/q)*\ln(I_{28}/I_{s28})-(kT/q)*\ln(I_{26}/I_{s26}) \quad (3)$$

where k is Boltzmann's constant ($1.38\times10^{-23}$), T is the temperature in Kelvin, q is the electron's charge, $I_{s26}$ and $I_{s28}$ are constant values, respectively defined by the transfer characteristics of transistors 26 and 28 in the forward-active region.

Equation (3) may be simplified as:

$$VBE_{28}-VBE_{26}=(kT/q)*\ln(X*(I_{s26}/I_{s28})) \quad (4)$$

where $I_{26}/I_{28}$ is the ratio of the base-emitter areas of transistors 26 and 28.

Assume the area of transistor 28 is Y times the area of transistor 26. Since $I_{28}=X*I_{26}$, the voltage of region 20 is defined by the following:

$$VBE_{28}-VBE_{26}=(kT/q)*\ln(X/Y) \quad (5)$$

Since (kT/q) is constant for any given temperature, from equation (5) it is seen that the voltage of region 20 may be controlled by selecting the ratio of X and Y. For example, if X and Y are both selected to be equal to 1, the voltage of n-type region 20 with respect to ground may be set to zero. If Y is selected to be twice as large as X, the voltage of n-type region 20 with respect to ground may be set to (−18m V) at room temperature. It is often desirable to set the clamp point slightly below ground to prevent the circuit from conducting current during a shutdown state.

Current limiting resistor 30 limits the amount of current $I_{26}$ flowing through transistors 26 and 24, according to the following:

$$I_{26}=((\text{voltage of clamped region 20})-V_{Test})/(R_{30})$$

where $R_{30}$ is the resistance of resistor 30; this resistance is typically selected to be sufficiently large to keep the currents flowing through transistors 22, 24, 26, and 28 relatively small in order to ensure proper operation.

PNP transistors 22 and 24 may be either lateral or vertical PNP transistors. Transistors 26, 28 and 32 may be either lateral or vertical NPN transistors. Transistor 32 may be a parasitic NPN transistor that when selected to be a lateral NPN transistor may be formed by placing n-type region 20 in close proximity of transistors 22, 24, or alternatively by placing an n-type moat around n-type region 20 and connecting the moat to the bases of transistors 22 and 24.

Figure 3A:
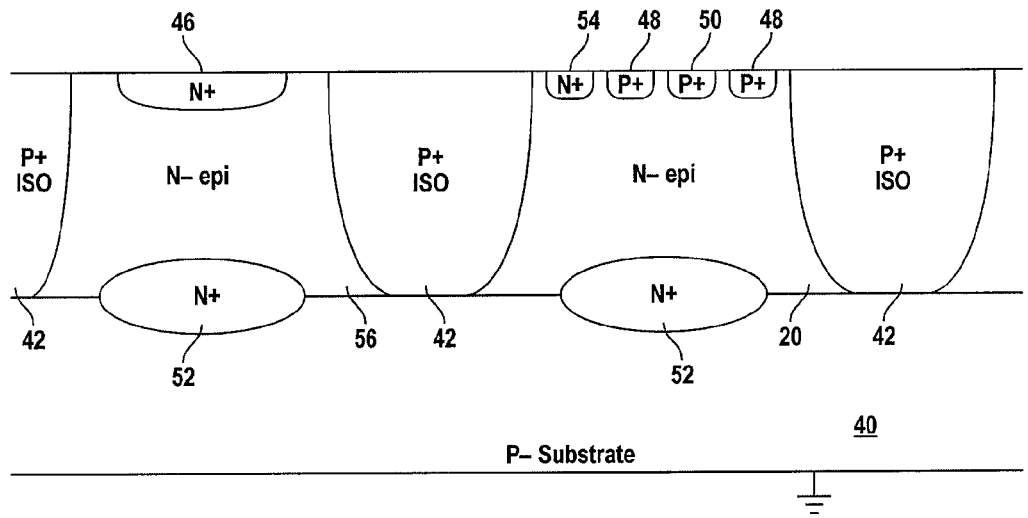
FIG. 3A is a cross-section of a substrate showing a number of different regions associated with the circuit of FIG. 2, in accordance with one exemplary embodiment of the present invention.

Concurrent references are made below to FIGS. 2 and 3A. FIG. 3A is a cross-sectional view of a semiconductor substrate 40 having formed therein a number of different regions associated with clamp circuit 50 of FIG. 2, in accordance with one exemplary embodiment of the present invention. N-type region 20 is assumed to be an epitaxial region that is clamped in accordance with one embodiment of the present invention. In the embodiment shown in FIG. 3A, it is assumed that transistors 22 and 24 (see FIG. 2) are not in the vicinity of n-type region 20. N-type region 56 and n+ region 46 is connected to the base terminals of transistors 22, 24 via a metal layer (not shown) and form the collector region of transistor 32 of FIG. 2. P-type substrate region 40 and n-type region 20 respectively form the base and emitter regions of transistor 32 of FIG. 2.

Figure 3B:
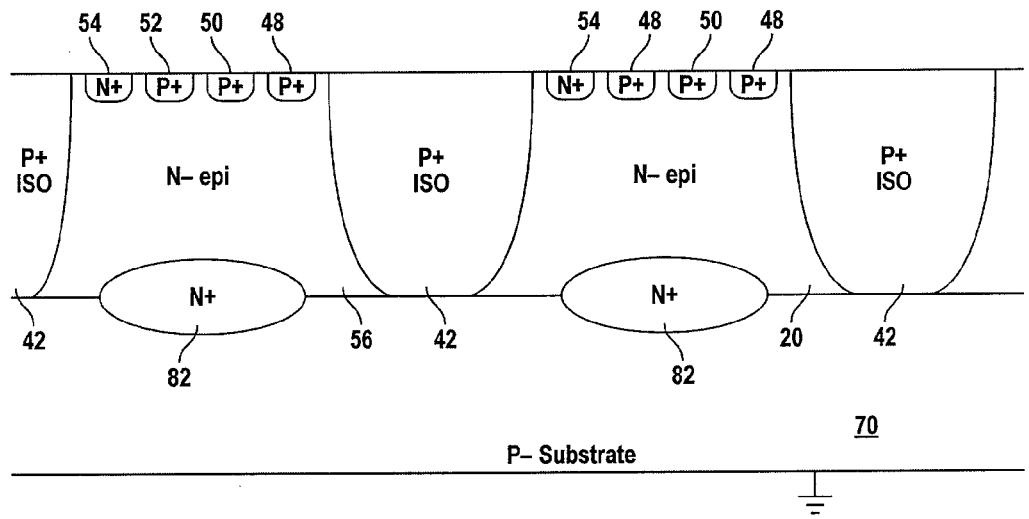
FIG. 3B is a cross-section of a substrate showing a number of different regions associated with the circuit of FIG. 2, in accordance with another exemplary embodiment of the present invention.

Concurrent references are made below to FIGS. 2 and 3B. FIG. 3B is a cross-sectional view of a semiconductor substrate 70 having formed therein a number of different regions associated with clamp circuit 50 of FIG. 2, in accordance with another exemplary embodiment of the present invention. In this embodiment, n-type region 56 and n+ region 54 together are assumed to form the base region of transistor 24 (or 22), as well as the collector terminal of transistor 32. P-type substrate region 40 and n-type region 20 respectively form the base and emitter regions of transistor 32 of FIG. 2.

Figure 4:
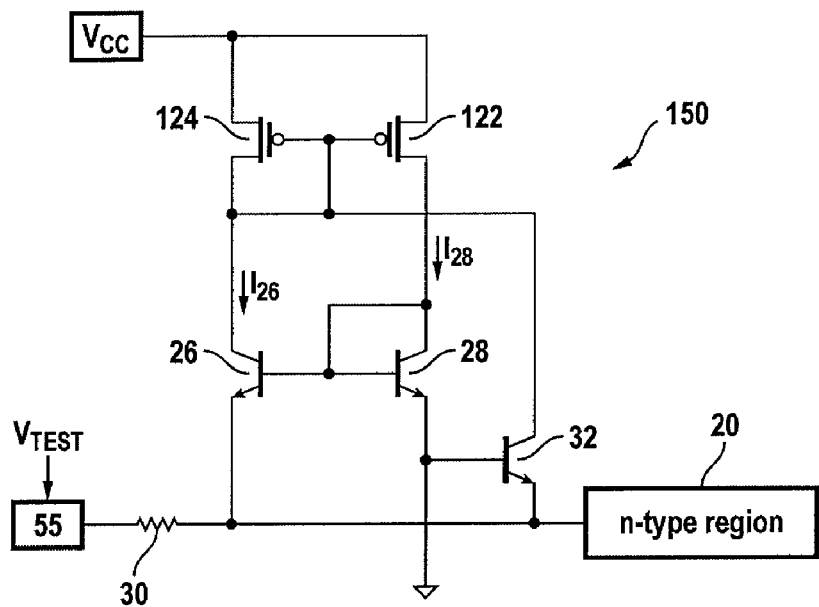
FIG. 4 is a schematic diagram of a circuit adapted to clamp the voltage applied to an n-type semiconductor region, in accordance with one exemplary embodiment of the present invention.

FIG. 4 is a transistor schematic diagram of a clamping circuit 150 adapted to clamp n-type semiconductor region 20 to a known voltage, in accordance with another exemplary embodiment of the present invention. Clamping circuit 150 is similar to clamping circuit 50 except that in clamping circuit 150, transistors 122 and 124 are PMOS transistors. The ratio of the channel-width to channel length of transistors 122, 124, in addition to the ratio of the emitter-base areas of transistors 26 and 28 collectively define the voltage at which n-type region 20 is clamped.

Figure 5:
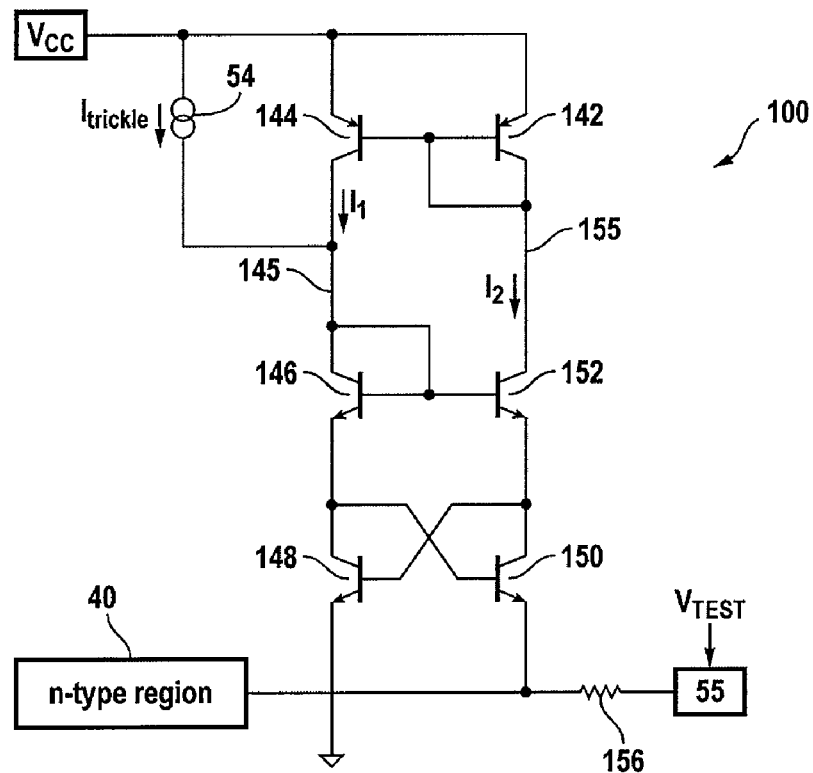
FIG. 5 is a schematic diagram of a circuit adapted to clamp the voltage applied to an n-type semiconductor region, in accordance with one exemplary embodiment of the present invention.

FIG. 5 is a transistor schematic diagram of a clamping circuit 100 adapted to clamp n-region 40 to a known voltage, in accordance with another exemplary embodiment of the present invention. Clamping circuit 100 is shown as including bipolar PNP transistors 142, 144, as well as bipolar NPN transistors 146, 148, 150 and 152. PNP transistors 142 and 144 have the same base-emitter voltages and form a current mirror, accordingly, current $I_1$ supplied by this current mirror is proportional or substantially equal to current $I_2$ received by this current mirror. Current $I_1$ is shown as also flowing through transistors 146 and 148. Likewise, current $I_2$ is shown as also flowing through transistors 150 and 152. Current limiting resistor 156 is disposed between the emitter terminal of transistor 150 and node 55 to which voltage $V_{Test}$ is applied.

Current $I_{trickle}$ supplied by current source 54 is used to properly start up clamping circuit 150. As described above, transistors 142 and 144 form a current mirror, thus setting the currents that flow through transistors 146, 148, on the one hand, and transistors 150 and 152, on the other, at a predetermined ratio. The voltage of the clamped n-type region 40 relative to the ground is defined by the following:

$$VBE_{150}+VBE_{146}-VBE_{152}VBE_{148} \quad (6)$$

where $VBE_{150}$, $VBE_{146}$, $VBE_{152}$, and $VBE_{148}$ represent the base-emitter voltages of transistors 150, 146, 152 and 148 respectively.

By selecting the ratio of the base-emitter areas of the various transistors shown in FIG. 5, the voltage at which n-type region 40 is clamped, is set to a desired value. N-type region 40 is clamped in accordance with the following expression:

$$\left(\frac{KT}{q}\right)\ln\left(\frac{I_{s152} \times I_{s148}}{I_{s146} \times I_{s150}}\right) \quad (7)$$

where $L_{s152}$, $L_{s148}$, $L_{s146}$, and $L_{s150}$ are values respectively defined by the transfer characteristics of transistors 152, 148, 146 and 150 in the forward-active region. Cross-coupled transistors 148 and 150 reduce the output impedance and improve the power supply rejection ratio. In some embodiments, PMOS transistors may be used in place of PNP transistors 142 and 144. The cross-coupled transistors 148 and 150 cancel collector current mismatches between transistors 142, 152 and 150 disposed in current leg 155, and transistors 144, 146 and 148 disposed in current leg 145. If the supply voltage $V_{cc}$ rises, early voltage effects cause a shift in the current ratio of transistors 142 and 144. The cross-coupling of transistors 148 and 150 cancels out such a current shift, thereby improving the power supply rejection ratio. As n-type region 40 is pulled further below the ground potential, the level of currents flowing through the base terminals of transistors 142 and 144 increases. The cross-coupling of transistors 148 and 150 cancels out any shift that would otherwise occur in the collector currents of transistors 142 and 144 as a result of increases in the base currents of these two transistors.

Figure 6:
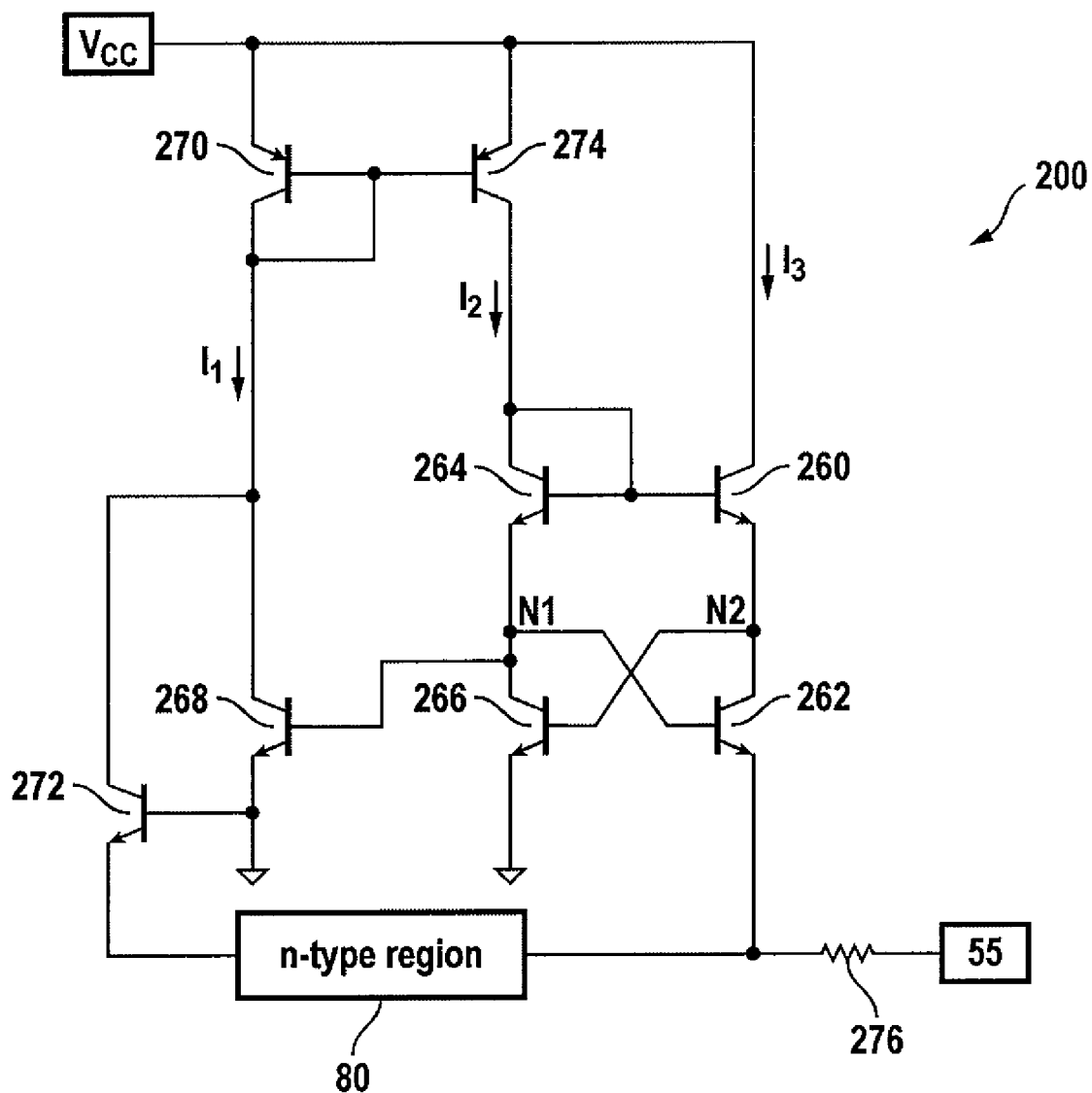
FIG. 6 is a schematic diagram of a circuit adapted to clamp the voltage applied to an n-type semiconductor region, in accordance with one exemplary embodiment of the present invention.

FIG. 6 is a transistor schematic diagram of a clamping circuit 200 adapted to clamp n-region 80 to a known voltage, in accordance with another exemplary embodiment of the present invention. Clamping circuit 200 is shown as including, in part, bipolar PNP transistors 270, 272, as well as bipolar NPN transistors 268, 266, 264, 260 and 262. Transistor 272, also disposed in clamping circuit 200, may be a parasitic NPN transistor used to start up circuit 200. The following description is provided with reference to setting the clamp voltage of n-region 80 to nearly 0 volts, i.e., the ground potential. It is understood, however, that the clamp voltage of n-region 80 may be selectively set to any other desired value by varying the ratio of the emitter-base areas of the various transistors shown in circuit 200 in a manner generally similar to that described above with respect to FIG. 2.

Current limiting resistor 276 is disposed between the emitter terminal of transistor 262 and node 55 to which voltage $V_{Test}$ is applied. As voltage $V_{Test}$ is pulled below the ground potential, transistor 272 is turned on, thereby pulling a relatively small amount of current out from the base terminals of transistors 270 and 274, in turn, ensuring that circuit 200 starts up properly.

Transistors 270 and 274 form a current mirror, therefore assuming transistors 270 and 274 have similar base-emitter areas, current $I_1$ is substantially equal to current $I_2$. Therefore, assuming that the base currents are negligible, the collector currents of transistors 266 and 268 are substantially equal. Consequently, the base-emitter voltage of transistor 268, namely $VBE_{268}$, is substantially equal to the base-emitter voltage of transistor 266, namely $VBE_{266}$. Since the emitter terminals of both transistors 268 and 266 receive the ground potential, the voltage at node N1 is substantially equal to the voltage at node N2.

Because the emitter voltages of transistors 260 and 264 are substantially the same and the base terminals of these two transistors are coupled to one another, current $I_2$ flowing through transistor 264 is substantially equal to current $I_3$ flowing through transistor 260. Hence, neglecting base currents, because current $I_2$ is equal to current $I_3$, the base-emitter voltage of transistor 266, i.e., $VBE_{266}$ is substantially equal to the base-emitter voltage of transistor 262, i.e., $VBE_{262}$. Likewise, the base-emitter voltage of transistor 264, i.e., $VBE_{264}$ is substantially equal to the base-emitter voltage of transistor 266. Accordingly:

$$VBE_{268} = VBE_{266} = VBE_{264} = VBE_{260} = VBE_{262} \quad (8)$$

As seen from FIG. 5, the voltage at n-type region 80 is defined by the following expression:

$$VBE_{266} + VBE_{260} - VBE_{264} - VBE_{262} \quad (9)$$

Since the base-emitter voltages of transistors 266, 260, 264 and 262 are substantially the same, as shown in expression (8), the voltage at n-type region 80 is nearly equal to zero. As described above, by varying the ratio of the emitter-base areas of the transistors shown in circuit 100, the voltage at which n-type region 80 is clamped, may be selectively set to any other desired value. N-type region 80 is clamped in accordance with the following expression:

$$\left(\frac{KT}{q}\right)\ln\left(\frac{I_{s264} \times I_{s262}}{I_{s266} \times I_{s260}}\right) \quad (10)$$

where $L_{s265}$, $L_{s262}$, $L_{s266}$, and $L_{s260}$ are values respectively defined by the transfer characteristics of transistors 264, 262, 266 and 260 in the forward-active region.

The above embodiments of the present invention are illustrative and not limiting. Various alternatives and equivalents are possible. The invention is not limited by the type of transistors or integrated circuits in which the present invention may be disposed. Nor is the disclosure limited to any specific type of process technology, e.g., CMOS, Bipolar, or mCMOS that may be used to manufacture the present disclosure. Other additions, subtractions or modifications are obvious in view of the present disclosure and are intended to fall within the scope of the appended claims.

What is claimed is:

1. A clamping circuit for controlling a clamp voltage of a semiconductor region in a semiconductor substrate, the clamping circuit comprising:
    a current mirror circuit including first and second transistors,
    a start up circuit configured to start up the clamping circuit, the start up circuit being responsive to a predetermined level of a voltage applied to the semiconductor region by providing a first current flowing through control terminals of the first and second transistors, the current mirror circuit being configured to supply a second current in response to the first current,
    a third transistor configured for producing a first voltage in accordance with the first current, and
    a fourth transistor configured for producing a second voltage in accordance with the second current,
    the clamp voltage corresponding to a difference between the first voltage and the second voltage.

2. The clamping circuit of claim 1, wherein the start up circuit includes a start up transistor disposed in the clamping circuit.

3. The clamping circuit of claim 2, wherein the start up transistor is a parasitic transistor formed at a connection of the clamping circuit with the semiconductor region.

4. The clamping circuit of claim 2, wherein the semiconductor region is an n-type region, and the start up transistor is an NPN transistor.

5. The clamping circuit of claim 4, wherein the NPN transistor is a parasitic transistor formed at a connection of the clamping circuit with the n-type region.

6. The clamping circuit of claim 2, further comprising a fifth transistor for producing a third voltage and a sixth transistor for producing a fourth voltage, the fifth and sixth transistors having control terminals supplied with the second current.

7. The clamping circuit of claim 6, wherein the clamp voltage is defined by a difference between a sum of the first and fourth voltages and a sum of the second and third voltages.

8. The clamping circuit of claim 2, wherein the first to fourth transistors are bipolar transistors.

9. The clamping circuit of claim 2, wherein the start up transistor and the first to fourth transistors are MOS transistors.

10. A method of controlling a clamp voltage of a semiconductor region in a semiconductor substrate using a clamping circuit, the method comprising the steps of:

in response to a predetermined level of a voltage applied to the semiconductor region, starting up the clamping circuit by activating a start up circuit disposed in the clamping circuit, to provide a first current to a circuit that produces a second current in response to the first current, producing a first voltage in accordance with the first current, and producing a second voltage in accordance with the second current, the clamp voltage corresponding to a difference between the first voltage and the second voltage.

11. The method of claim 10, wherein the clamping circuit is started up by activating a transistor disposed in the clamping circuit.

12. The method of claim 10, wherein the clamping circuit is started up by activating a parasitic transistor formed at a connection of the clamping circuit with the semiconductor region.

13. The method of claim 10, wherein the clamping circuit is started up by activating a bipolar transistor in the clamping circuit.

14. The method of claim 10, wherein the clamping circuit is started up by activating a MOS transistor in the clamping circuit.

* * * * *